US008740475B2

(12) United States Patent
Wu

(10) Patent No.: US 8,740,475 B2
(45) Date of Patent: Jun. 3, 2014

(54) HIGH-FREQUENCY TRANSMISSION MODULE AND OPTICAL CONNECTOR HAVING STACKED CHIPS CONNECTED VIA WIRE BONDING

(75) Inventor: Kai-Wen Wu, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 17 days.

(21) Appl. No.: 13/555,175

(22) Filed: Jul. 22, 2012

(65) Prior Publication Data

US 2013/0251313 A1 Sep. 26, 2013

(30) Foreign Application Priority Data

Mar. 22, 2012 (TW) .............................. 101109925 A

(51) Int. Cl.
*G02B 6/00* (2006.01)
*G02B 6/36* (2006.01)
*H01L 23/48* (2006.01)
*H01L 21/70* (2006.01)

(52) U.S. Cl.
USPC .............. 385/88; 257/741; 257/777; 385/147

(58) Field of Classification Search
USPC ................ 385/88–90, 147; 257/741, E23.01, 257/E23.02, E23.021, E33.066, 780, 781, 257/784, 786, 737, 678, 664
See application file for complete search history.

(56) References Cited

U.S. PATENT DOCUMENTS

| | | | |
|---|---|---|---|
| 6,437,449 B1 * | 8/2002 | Foster | 257/777 |
| 6,963,123 B2 * | 11/2005 | Nagase et al. | 257/678 |
| 7,183,581 B2 * | 2/2007 | Nagai et al. | 257/82 |
| 7,417,324 B2 * | 8/2008 | Obiya | 257/780 |
| 7,650,693 B2 * | 1/2010 | Offrein et al. | 29/840 |
| 8,232,141 B2 * | 7/2012 | Choi et al. | 438/110 |
| 2003/0091258 A1 * | 5/2003 | Uesaka et al. | 385/2 |
| 2011/0049334 A1 * | 3/2011 | Nasu et al. | 250/208.2 |
| 2012/0280386 A1 * | 11/2012 | Sato et al. | 257/737 |
| 2013/0256850 A1 * | 10/2013 | Danny et al. | 257/664 |
| 2014/0011453 A1 * | 1/2014 | Kuroda et al. | 455/41.2 |

* cited by examiner

*Primary Examiner* — Akm Enayet Ullah
(74) *Attorney, Agent, or Firm* — Novak Druce Connolly Bove + Quigg LLP

(57) ABSTRACT

A high-frequency transmission module includes a first chip, a second chip, and a conductive wire. The first chip includes a first top surface and a number of pads arranged along a periphery of the first top surface. The pads include a first bonding pad. The second chip includes a second top surface and a second bonding pad on the second top surface. The second chip is positioned on the first top surface such that the pads are uncovered by the second chip and the second bonding pad is mostly closed to the first bonding pad. The conductive wire bonds to the first bonding pad and the second bonding pad to electrically connect the second chip to the first chip and is configured to transmit high-frequency signals between the first chip and the second chip.

3 Claims, 4 Drawing Sheets

HIGH-FREQUENCY TRANSMISSION MODULE AND OPTICAL CONNECTOR HAVING STACKED CHIPS CONNECTED VIA WIRE BONDING

CROSS-REFERENCE TO RELATED APPLICATIONS

Not applicable

STATEMENT REGARDING FEDERALLY SPONSORED RESEARCH OR DEVELOPMENT

Not applicable

THE NAMES OF THE PARTIES TO A JOINT RESEARCH AGREEMENT

Not applicable

INCORPORATION-BY-REFERENCE OF MATERIAL SUBMITTED ON A COMPACT DISC OR AS A TEXT FILE VIA THE OFFICE ELECTRONIC FILING SYSTEM (EFS-WEB)

Not applicable

STATEMENT REGARDING PRIOR DISCLOSURES BY THE INVENTOR OR A JOINT INVENTOR

Not applicable

BACKGROUND OF THE INVENTION (1) Field of the invention

The present disclosure relates to high-frequency transmission technologies and, particularly, to a high-frequency transmission module and an optical connector.

(2) Description of Related Art including information disclosed under 37 CFR 1.97 and 1.98

Optical connectors include a laser diode and a driver. Gold wires are utilized to electrically connect the laser diode to the driver by a wire bonding technology and to transmit high-frequency signals between the laser diode and the driver. However, an equivalent inductance of the gold wires reduces a bandwidth (i.e., a transmission frequency) of the gold wires, thus decreasing an entire bandwidth of the optical connector. The longer the gold wires are, the lower the bandwidth is.

Therefore, it is desirable to provide a high-frequency transmission module and an optical connector, which can overcome the above-mentioned shortcomings.

BRIEF SUMMARY OF THE INVENTION

Not applicable

BRIEF DESCRIPTION OF THE SEVERAL VIEW OF THE DRAWINGS

DETAILED DESCRIPTION OF THE INVENTION

Embodiments of the disclosure will be described in detail, with reference to the accompanying drawings.

Figure 1:
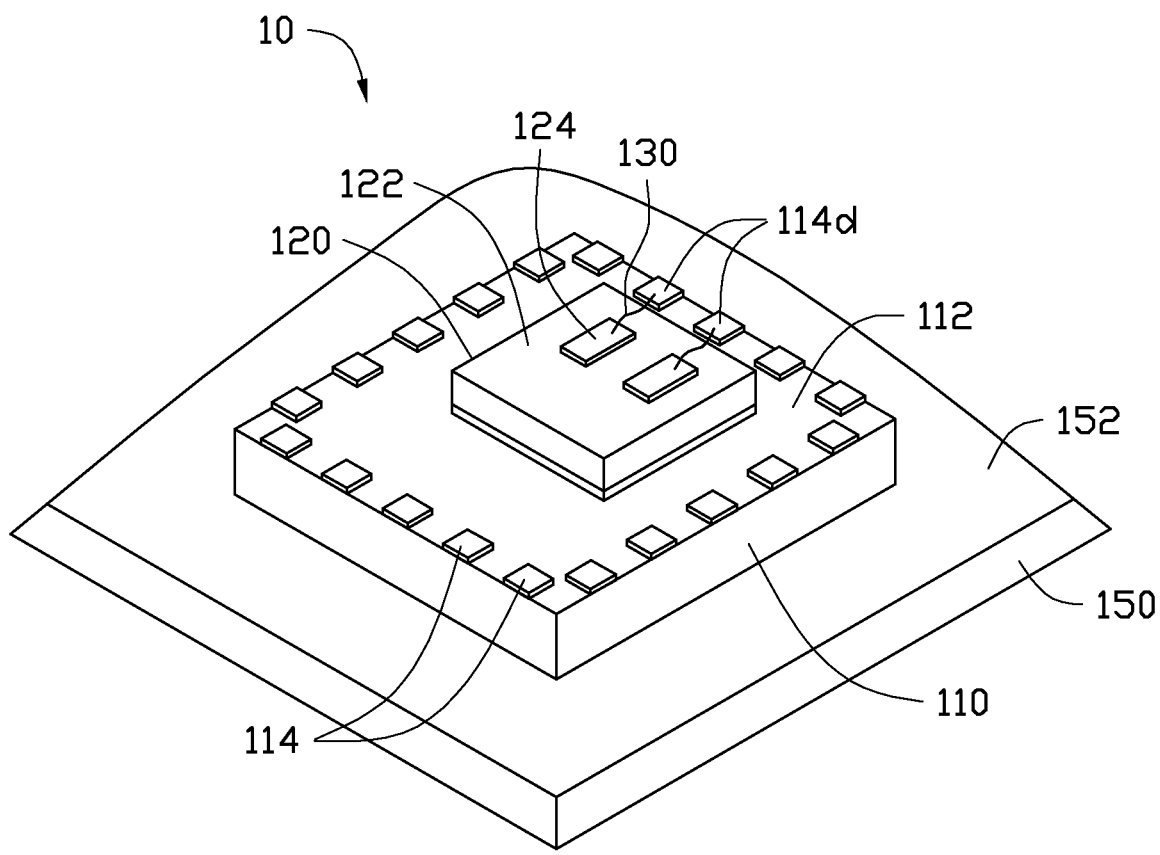
FIG. 1 is an isometric schematic view of a high-frequency transmission module, according to an embodiment.
Figure 2:
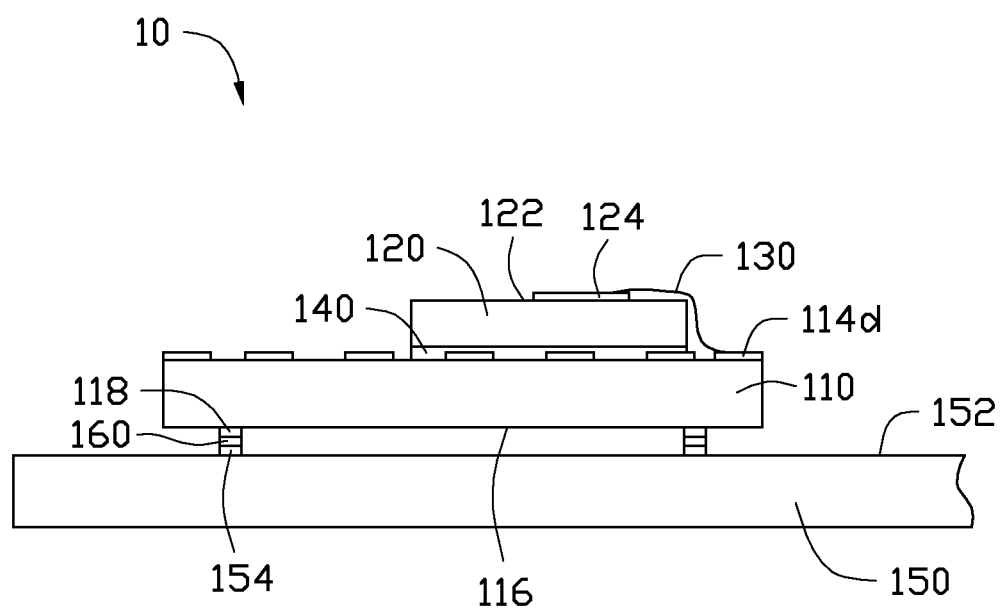
FIG. 2 is a planar schematic view of the high-frequency transmission module of FIG. 1.

FIGS. 1-2, illustrate a high-frequency transmission module 10 in accordance to an embodiment. The high-frequency transmission module 10 includes a first chip 110, a second chip 120, and two first conductive wires 130.

The first chip 110 includes a first top surface 112 and forms a number of first pads 114 arranged along a periphery of the first top surface 112. The first pads 114 include two first bonding pads 114d positioned adjacent to each other.

The second chip 120 includes a second top surface 122 and forms two second bonding pads 124 on the second top surface 122, corresponding to the first bonding pads 114d. The second chip 120 is positioned on the first top surface 112 such that the first pads 114 are spaced from and uncovered by the second chip 120 and the second bonding pads 124 are mostly closed to the respective first bonding pads 114d. The second chip 120 is electrically connected to the first chip 110 by bonding the first conductive wires 130 to the first bonding pads 114d and the respective second bonding pads 124.

The first conductive wires 130, such as gold wires, are configured for transmitting high-frequency signals between the first chip 110 and the second chip 120.

As such, the first conductive wires 130 can be shorten, to the maximum extent practicable. Accordingly, adverse influence of the first conductive wires 130 on a bandwidth of the high-frequency transmission module 10 can be reduced. In addition, cost of the high-frequency transmission module 10 can be reduced as well.

In this embodiment, the high-frequency transmission module 10 also includes a first glue layer 140. The second chip 120 is glued to the first chip 110 by the glue layer 140.

The high-frequency transmission module 10 includes a substrate 150 and a conductive adhesive layer 160. The substrate 150 includes a third top surface 152 and forms a number of second pads 154 on the third top surface 152. The first chip 110 is a semiconductor die and includes a first bottom surface 116 opposite to the first top surface 112. The first chip 110 also includes a number of third pads 118 on the first bottom surface 118. The first chip 110 is positioned on the substrate 150 and electrically connected to the substrate 150 by connecting the third pads 118 to the respective second pads 154 via the conductive adhesive layer 160.

The number of the first bonding pads 114d, the second bonding pads 124, and the first conductive wires 130 is not limited to the embodiment, but can be set depending on requirements. In other embodiments, only one first and second bonding pad and only one first conductive wire can be employed.

Figure 3:
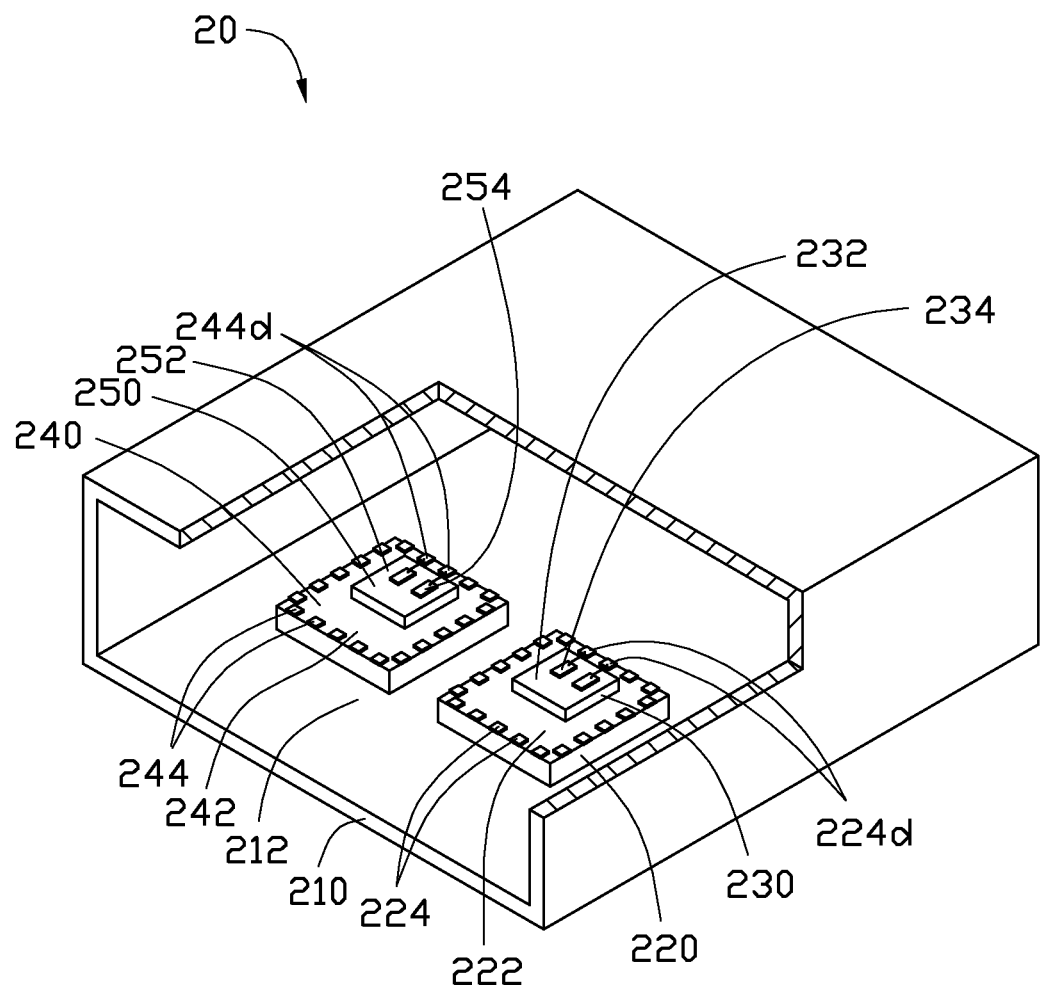
FIG. 3 is a cutaway view of an optical connector according to another embodiment.
Figure 4:
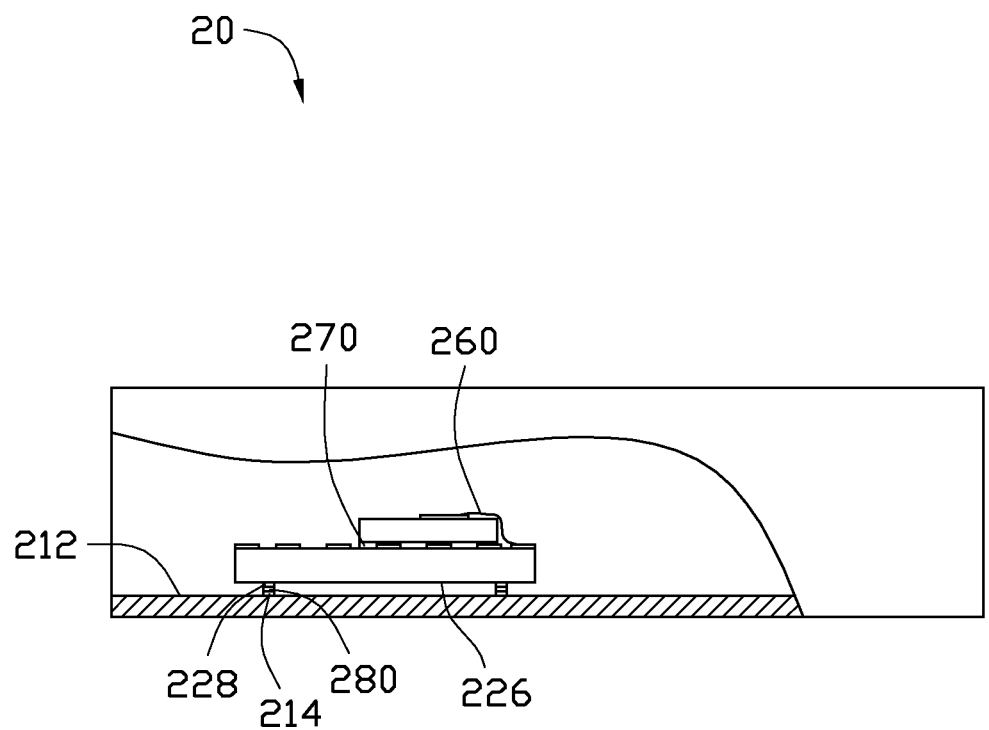
FIG. 4 is a planar, partially cross-sectioned, schematic view of the optical connector of FIG. 3.

FIGS. 3-4, illustrate an optical connector 20 in accordance to another embodiment. The optical connector 20 includes a printed circuit board (PCB) 210, a driver 220, a laser diode 230, a photoelectric converter 240, a photo diode 250, and four second conductive wires 260.

The driver 220 includes a fourth top surface 222 and a number of fourth pads 224 arranged along a periphery of the fourth top surface 222. The fourth pads 224 include two third bonding pads 224d arranged adjacent to each other.

The photoelectric converter 240 includes a fifth top surface 242 and a number of fifth pads 244 arranged along a periphery of the fifth top surface 242. The fifth pads 244 include two fourth bonding pads 244d arranged adjacent to each other.

The laser diode 230 includes a sixth top surface 232 and two fifth bonding pads 234 on the sixth top surface 232. The laser diode 230 is positioned on the fourth top surface 222 such that the fourth pads 224 are spaced from and uncovered by the laser diode 230 and the fifth bonding pads 234 are mostly closed to the respective third bonding pads 224d. The laser diode 230 is electrically connected to the driver 220 by bonding two of the conductive wires 260 to the third bonding pads 224d and the respective fifth bonding pads 234.

The photo diode 250 includes a seventh top surface 252 and two sixth bonding pads 254 on the seventh top surface 252. The photo diode 250 is positioned on the fifth top surface 242 such that the fifth pads 244 are spaced from and uncovered by the photo diode 250 and the sixth bonding pads 254 are mostly closed to the respective fourth bonding pads 244d. The photo diode 250 is electrically connected to the photoelectric converter 240 by bonding the other two of the conductive wires 260 to the fourth bonding pads 244d and the respective sixth bonding pads 254.

The second conductive wires 260, such as gold wires, are configured for transmitting high-frequency signals between the driver 220 and the laser diode 230 and between the photoelectric converter 240 and the photo diode 250.

As such, the second conductive wires 260 can be shortened, to the maximum extent practicable. Accordingly, adverse influence of the second conductive wires 260 on a bandwidth of the optical connector 20 can be reduced. In addition, cost of the optical connector 20 can be reduced as well.

In this embodiment, the optical connector 20 also includes two second glue layers 270. The laser diode 230 is glued to the driver 220 and the photo diode 250 is glued to the photoelectric converter 240 by the respective second glue layers 270.

The optical connector 20 includes a second conductive adhesive layer 280. The PCB 210 includes an eighth top surface 212 and forms a number of sixth pads 214. The driver 220 and the photoelectric converter 240 are semiconductor dies and each includes a second bottom surface 226 opposite to the fourth top surface 222 and the fifth top surface 242. Both the driver 220 and the photoelectric converter 240 include a number of seventh pads 228 on the second bottom surface 226. The driver 220 and the photoelectric converter 240 are positioned on the PCB 210 and electrically connected to the PCB 210 by connecting the seventh pads 228 to the respective sixth pads 214 via the first conductive adhesive layer 280.

The number of the third bonding pads 224d, the fourth bonding pads 244d, the fifth bonding pads 234, the sixth bonding pads 254, and the second conductive wires 260 is not limited to the embodiment, but can be set depending on requirements. In other embodiments, only one third, fourth, fifth, and sixth bonding pad and two second conductive wires can be employed.

Particular embodiments are shown here and described by way of illustration only. The principles and the features of the present disclosure may be employed in various and numerous embodiments thereof without departing from the scope of the disclosure as claimed. The above-described embodiments illustrate the scope of the disclosure but do not restrict the scope of the disclosure.

What is claimed is:

1. A high-frequency transmission module, comprising:
a first chip comprising a first top surface and a plurality of first pads arranged along a periphery of the first top surface, the first pads comprising a first bonding pad;
a second chip comprising a second top surface and a second bonding pads on the second top surface, the second chip being positioned on the first top surface such that the first pads are uncovered by the second chip and the second bonding pad is close to the first bonding pad;
a first conductive wire bonding to the first bonding pad and the second bonding pad to electrically connect the second chip to the first chip and configured to transmit high-frequency signals between the first chip and the second chip;
a substrate; and
a conductive adhesive layer, the substrate comprising a third top surface and a plurality of second pads on the third top surface, the first chip comprising a first bottom surface opposite to the first top surface and a plurality of third pads on the first bottom surface, the first chip being positioned on the substrate and electrically connected to the substrate by connecting the third pads to the respective second pads via the conductive adhesive layer.

2. The high-frequency transmission module of claim 1, further comprising a first glue layer, the second chip being glued to the first chip by the glue layer.

3. The high-frequency transmission module of claim 1, wherein the first conductive wire is a gold wire.

* * * * *